(12) United States Patent  (10) Patent No.: US 12,408,340 B2
Ikeda et al.  (45) Date of Patent: Sep. 2, 2025

(54) MEMORY DEVICE INCLUDING A CONDUCTIVE FILM WITH INTERFACIAL ROUGHNESS

(71) Applicant: KIOXIA CORPORATION, Tokyo (JP)

(72) Inventors: Mitsuo Ikeda, Yokkaichi Mie (JP); Daisuke Ikeno, Yokkaichi Mie (JP); Akihiro Kajita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 798 days.

(21) Appl. No.: 17/681,357

(22) Filed: Feb. 25, 2022

(65) Prior Publication Data

US 2023/0092843 A1  Mar. 23, 2023

(30) Foreign Application Priority Data

Sep. 22, 2021 (JP) ................. 2021-154913

(51) Int. Cl.
*H10B 43/27* (2023.01)
*H10B 41/27* (2023.01)
*H10B 41/30* (2023.01)
*H10B 41/35* (2023.01)
*H10B 43/30* (2023.01)
*H10B 43/35* (2023.01)

(52) U.S. Cl.
CPC ............ *H10B 43/27* (2023.02); *H10B 41/27* (2023.02); *H10B 41/30* (2023.02); *H10B 41/35* (2023.02); *H10B 43/30* (2023.02); *H10B 43/35* (2023.02)

(58) Field of Classification Search
CPC ... H01L 29/40117; H10B 43/27; H10B 43/35; H10B 41/27; H10B 41/30; H10B 41/35
See application file for complete search history.

(56) References Cited

U.S. PATENT DOCUMENTS

| | | | |
|---|---|---|---|
| 9,553,168 B2 | 1/2017 | Kwak | |
| 9,673,215 B1* | 6/2017 | Konagai | H10B 43/35 |
| 10,170,494 B2 | 1/2019 | Ishizaki et al. | |
| 10,777,453 B2 | 9/2020 | Thombare et al. | |
| 11,201,164 B2* | 12/2021 | Goda | H10D 64/037 |

(Continued)

FOREIGN PATENT DOCUMENTS

| | | |
|---|---|---|
| CN | 110249428 A | 9/2019 |
| JP | 6346595 B2 | 6/2018 |

(Continued)

*Primary Examiner* — Wael M Fahmy
*Assistant Examiner* — Aneesa Riaz Baig
(74) *Attorney, Agent, or Firm* — Kim & Stewart LLP

(57) ABSTRACT

According to one embodiment, a semiconductor device includes a tunnel insulating film, a charge trap film on the tunnel insulating film, and a block insulating film on the charge trap film. The charge trap film is between the tunnel insulating film and the block insulating film. A conductive film is on the block insulating film. The block insulating film is between the charge trap film and the conductive film. The conductive film includes a first metal film adjacent to the block insulating film and a second metal film on the first metal film. The first metal film is between the block insulating film and the second metal film. The first metal film has an interfacial roughness on a side facing the second metal film that is greater than an interfacial roughness on a side facing the block insulating film.

20 Claims, 9 Drawing Sheets

(56) References Cited

U.S. PATENT DOCUMENTS

| | | |
|---|---|---|
| 2017/0062466 A1 | 3/2017 | Ishizaki et al. |
| 2018/0219017 A1* | 8/2018 | Goda ..................... H10B 43/27 |
| 2019/0067429 A1* | 2/2019 | Lee ....................... H10B 43/35 |
| 2019/0172839 A1 | 6/2019 | Tokuda ................ H10D 30/693 |
| 2019/0378858 A1* | 12/2019 | Goda ..................... H10B 43/27 |
| 2020/0075403 A1 | 3/2020 | Thombare et al. |
| 2020/0388632 A1 | 12/2020 | Lee et al. |
| 2020/0388633 A1 | 12/2020 | Jung et al. |
| 2020/0402994 A1* | 12/2020 | Yang ..................... H10B 43/35 |
| 2021/0043646 A1 | 2/2021 | Hazue |
| 2021/0066468 A1 | 3/2021 | Bepp et al. |
| 2021/0083057 A1 | 3/2021 | Kitamura |
| 2022/0293620 A1* | 9/2022 | Kinoshita .............. H10B 43/27 |
| 2023/0092843 A1* | 3/2023 | Ikeda .................. H10D 64/037 |
| | | 257/347 |
| 2024/0081073 A1* | 3/2024 | Umino ................... H10B 43/35 |

FOREIGN PATENT DOCUMENTS

| | | |
|---|---|---|
| JP | 2019102684 A | 6/2019 |
| JP | 2021027190 A | 2/2021 |
| JP | 2021034591 A | 3/2021 |
| JP | 2021048239 A | 3/2021 |
| TW | 201421650 A | 6/2014 |

\* cited by examiner

MEMORY DEVICE INCLUDING A CONDUCTIVE FILM WITH INTERFACIAL ROUGHNESS

CROSS-REFERENCE TO RELATED APPLICATION(S)

This application is based upon and claims the benefit of priority from Japanese Patent Application No. 2021-154913, filed Sep. 22, 2021, the entire contents of which are incorporated herein by reference.

FIELD

Embodiments described herein relate generally to a semiconductor device incorporating a three-dimensional memory array or the like.

BACKGROUND

A three-dimensional memory is a known example of a semiconductor device.

DETAILED DESCRIPTION

Embodiments provide a technique for reducing diffusion of oxygen out of a conductive film due to a post-heat load.

In general, according to one embodiment, a semiconductor device includes a tunnel insulating film, a charge trap film on the tunnel insulating film, and a block insulating film on the charge trap film. The charge trap film is between the tunnel insulating film and the block insulating film. A conductive film is on the block insulting film. The block insulating film is between the charge trap film and the conductive film. The conductive film includes a first metal film adjacent to the block insulating film and a second metal film on the first metal film. The first metal film is between the block insulating film and the second metal film. The first metal film has an interfacial roughness on a side facing the second metal film that is greater than an interfacial roughness on a side facing the block insulating film.

Hereinafter, certain example embodiments according to the present disclosure will be described with reference to the drawings. These example embodiments are not intended to limit the present disclosure. In the following description, references to upper and lower directions and the like are relative directions with the surface of a semiconductor substrate on which a semiconductor element is provided being taken as an upper surface. These upper and lower directions are not necessarily in any particular relationship to gravitational acceleration. The drawings show schematic or conceptual examples, which may differ from actual components in such things as scale, dimensions, relative dimensions, number of components, ratios of parts, and the like. In the specification, elements that are substantially similar to those described in relation to one or more drawings already explained, are given the same reference symbols, and detailed descriptions thereof are appropriately omitted.

First Embodiment

Figure 1:
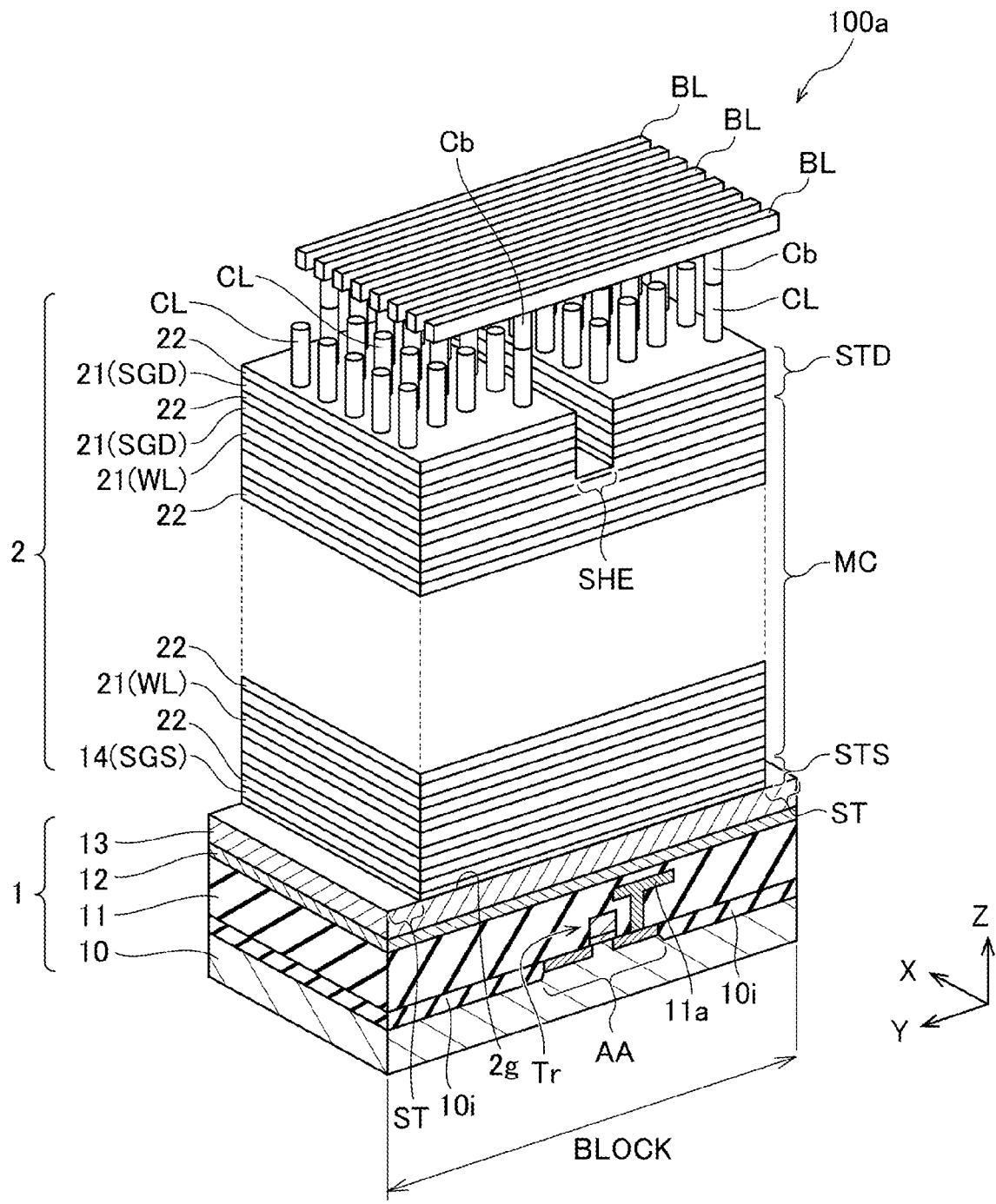
FIG. 1 is a perspective view of a semiconductor device according to a first embodiment.

FIG. 1 is a perspective view showing a structure example of a semiconductor device 100a according to a first embodiment. Herein, a stacking direction of a stacked body 2 is defined as a Z direction. A direction crossing the Z direction is defined as a Y direction. Another direction crossing each of the Z direction and the Y direction is defined as an X direction.

In this first embodiment, the semiconductor device 100a is a non-volatile memory including a three-dimensional memory cell array in which multiple memory cells are three-dimensionally arranged. For example, the non-volatile memory is a NAND flash memory.

The semiconductor device 100a includes a base body 1, a stacked body 2, and multiple columnar parts CL.

The base body 1 has a substrate 10, an insulating film 11, a conductive film 12, and a semiconductor part 13. The insulating film 11 is provided on the substrate 10. The conductive film 12 is provided on the insulating film 11. The semiconductor part 13 is provided on the conductive film 12.

The substrate 10 is a semiconductor substrate, for example, a silicon substrate. A surface region of the substrate 10 is provided with, for example, an element isolation area 10i. The element isolation area 10i is an insulating region comprising, for example, silicon oxide, and it serves to define an active area AA on the surface region of the substrate 10. The active area AA is provided with source and drain regions of a transistor Tr or the like. The transistor Tr constitutes a part of a peripheral circuit of the non-volatile memory. The insulating film 11 comprises, for example, silicon oxide, and it insulates the transistor Tr from surrounding elements or the like as necessary. A wiring 11a is provided in the insulating film 11. The wiring 11a is electrically connected to the transistor Tr. The conductive film 12 is a conductive metal, such as tungsten. The semiconductor part 13 is a semiconductor material, such as silicon.

The stacked body 2 is provided above the substrate 10 and is positioned on the semiconductor part 13 in the Z direction. The stacked body 2 includes multiple conductive films 21 and multiple insulating films 22 that are alternately stacked on one another in the Z direction. Thus, the Z direction is the stacking direction of the stacked body 2. The conductive film 21 comprises, for example, molybdenum. The insulating film 22 comprises, for example, silicon oxide. The insulating film 22 electrically insulates the conductive films 21, which are adjacent in the Z direction, from one another. The number of stacked conductive films 21 and insulating films 22 can be freely selected. In some examples, insulating film 22 may be, for example, a gap or void, which may sometimes be referred to as an air gap.

In the present non-limiting example, an insulating film 2g is provided between the stacked body 2 and the semiconductor part 13. The insulating film 2g comprises, for example, silicon oxide. The insulating film 2g may be a high dielectric material having a dielectric constant higher than that of silicon oxide.

The conductive films 21 provide at least one source-side select gate SGS, multiple word lines WL, and at least one drain-side select gate SGD. A source-side select gate SGS is a gate electrode of a source-side select transistor STS. A word line WL is a gate electrode of a memory cell MC. A drain-side select gate SGD is a gate electrode of a drain-side select transistor STD. The source-side select gate SGS is disposed in a lower region of the stacked body 2. The drain-side select gate SGD is disposed in an upper region of the stacked body 2. The word lines WL are provided between the source-side select gate SGS and the drain-side select gate SGD. There may be more than one source-side select gate SGS and the drain-side select gate SGD when more than one source-side select transistor STS and more one drain-side select transistor STD is provided, respectively.

The semiconductor device 100a includes multiple memory cells MC that are connected in series between the source-side select transistor STS and the drain-side select transistor STD. The structure of the source-side select transistor STS, the multiple memory cells MC, and the drain-side select transistor STD connected in series is referred to as a "memory string" or a "NAND string". Each memory string is connected to a bit line BL via a contact Cb or the like. The bit lines BL are provided above the stacked body 2 and extend in the Y direction.

Figure 2:
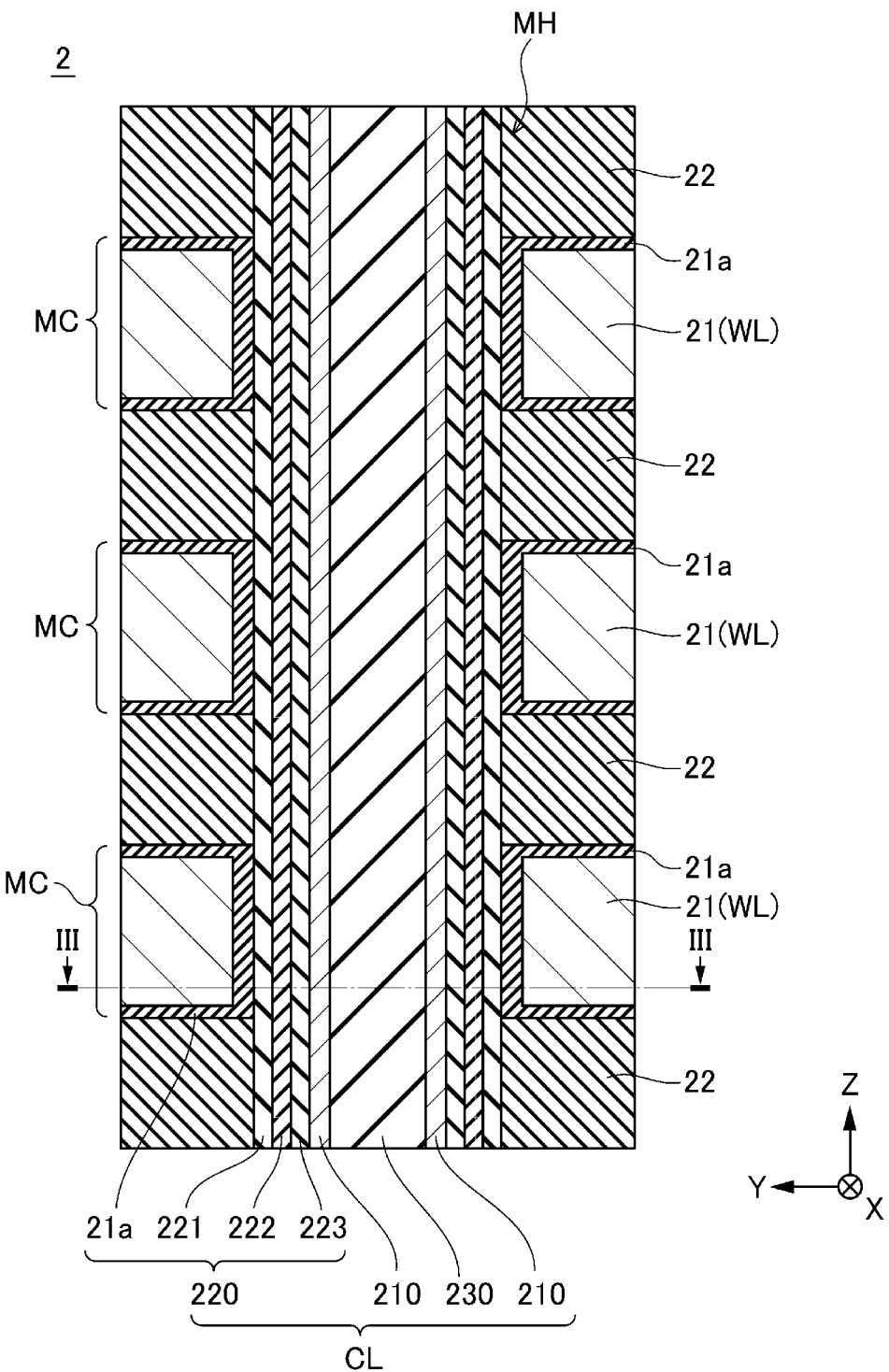
FIG. 2 is a cross-sectional view of a memory cell array.
Figure 3:
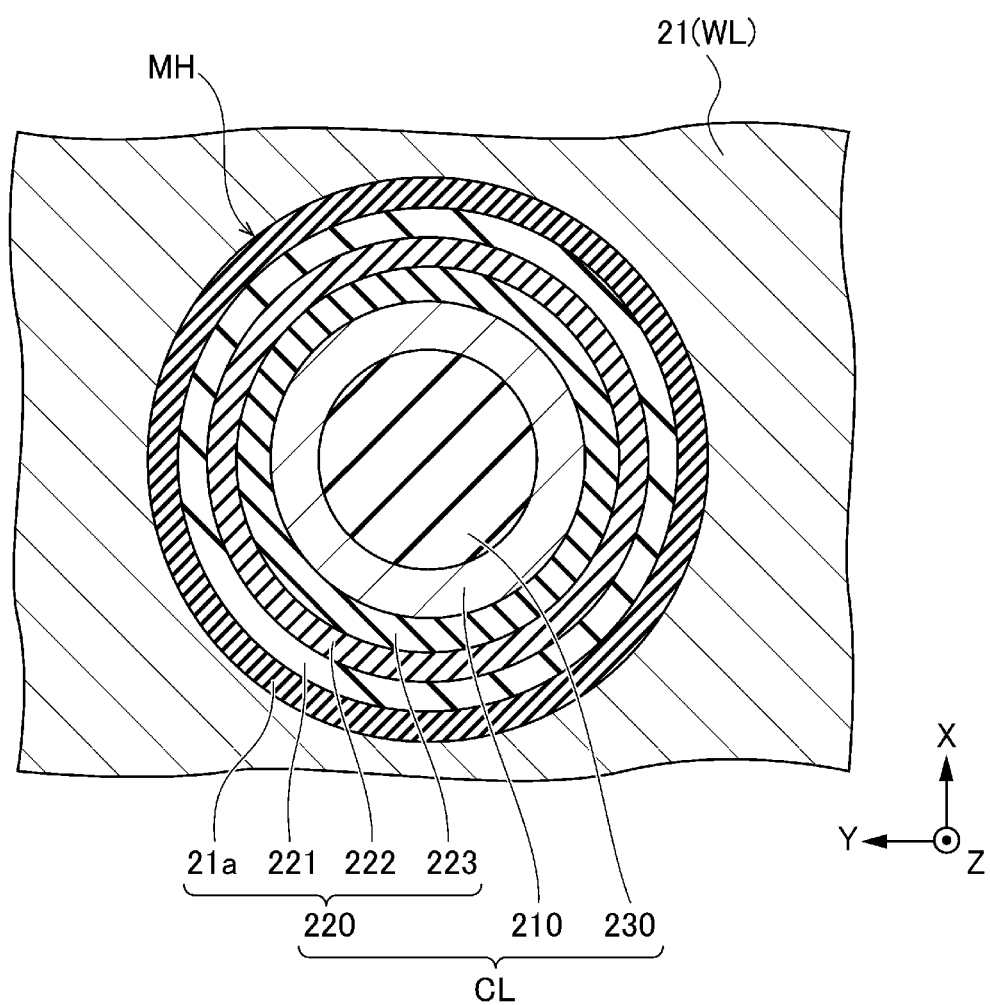
FIG. 3 is a cross-sectional view taken at a III-III line in FIG. 2.

FIG. 2 is a cross-sectional view showing an example of a three-dimensional structure of the memory cell array. FIG. 3 is a cross-sectional view taken at III-III line in FIG. 2.

Each of the multiple columnar parts CL depicted in FIG. 1 is provided in a memory hole MH that extends through the stacked body 2. The memory hole MH is provided in the Z direction in such a manner as to penetrate through the stacked body 2 from an upper end of the stacked body 2. A semiconductor body 210, a memory film 220, and a core layer 230 are provided inside the memory hole MH. At least some components of the memory film 220, and the semiconductor body 210 and the core layer 230 extend in the Z direction along the memory hole MH. The semiconductor body 210 can be electrically connected to the semiconductor part 13 and may be referred to as a semiconductor pillar or the like. The columnar parts CL that are arranged in the same row or the like along the Y direction are connected to the same bit line BL via the contacts Cb.

As illustrated in FIG. 3, the memory hole MH has, for example, a circular or elliptical shape in the X-Y plane. A first block insulating film 21a that constitutes a part of the memory film 220 is provided between the conductive film 21 and the insulating film 22. The first block insulating film 21a is an insulating metal oxide film, such as of aluminum oxide. The first block insulating film 21a is provided around the conductive film 21, and it is also provided between the conductive film 21 and the semiconductor body 210 and between the conductive film 21 and the insulating film 22. The first block insulating film 21a reduces back-tunneling of electric charges from the conductive film 21 to the memory film 220.

The semiconductor body 210 has, for example, a cylindrical shape. The semiconductor body 210 is a semiconductor material, such as polysilicon. The semiconductor body 210 serves as a channel region of each of the drain-side select transistor STD, the memory cell MC, and the source-side select transistor STS.

The memory film 220 includes the first block insulating film 21a, a second block insulating film 221, a charge trap film 222, and a tunnel insulating film 223. At least some components of the memory film 220 are cylindrically formed in such a manner as to extend in the Z direction along the inner wall of the memory hole MH. In addition, the memory film 220 is interposed between the semiconductor body 210 and the conductive film 21 or the insulating film 22. The memory cells MC have the memory film 220 between the semiconductor body 210 and the conductive films 21 serving as word lines WL. This portion of the memory film 220 between the semiconductor body 210 and the conductive films 21 function as storage regions. The memory cells MC sharing the same semiconductor body 210 are thus arranged along the Z direction one above the other. Each of the semiconductor body 210, the tunnel insulating film 223, the charge trap film 222, and the second block insulating film 221 is deposited along the inner wall of the memory hole MH and extends in the Z direction.

The second block insulating film 221 is provided between the insulating film 22 and the charge trap film 222 and between the conductive film 21 and the charge trap film 222. The second block insulating film 221 is, for example, silicon oxide. The second block insulating film 221 prevents the charge trap film 222 from being etched when a sacrificial film used in an intermediate manufacturing stage is replaced with the conductive film 21. The first block insulating film 21a and the second block insulating film 221 prevent electric charges from leaking from the charge trap film 222 to the conductive film 21.

The charge trap film 222 is provided between the second block insulating film 221 and the tunnel insulating film 223. The charge trap film 222 is, for example, silicon nitride. The charge trap film 222 includes trap sites for trapping electric charges. In the charge trap film 222, the part (charge trap part) that is interposed between the semiconductor body 210 and a conductive film 21 functioning as a word line WL functions as the storage region of the memory cell MC. The threshold voltage of the memory cell MC varies depending on the amount of electric charges trapped in the charge trap part. With this characteristic, the memory cell MC can store data based on the threshold voltage of the memory cell MC.

The tunnel insulating film 223 is provided between the semiconductor body 210 and the charge trap film 222. The tunnel insulating film 223 is an insulating material, such as silicon oxide, silicon nitride, or silicon oxynitride film. At the time electrons are injected from the semiconductor body 210 to the charge trap part in a write operation, and at the time holes are injected from the semiconductor body 210 to the charge trap part in an erase operation, these electrons or holes pass or tunnel through a potential barrier of the tunnel insulating film 223.

In this manner, the tunnel insulating film 223 is provided between the conductive film 21 and the semiconductor body 210. The charge trap film 222 is interposed between the tunnel insulating film 223 and the conductive film 21, and the first block insulating film 21a and the second block insulating film 221 are interposed between the charge trap film 222 and the conductive film 21. With this structure, the charge trap film 222 captures and releases electric charges from the semiconductor body 210 via the tunnel insulating film 223. On the other hand, the first block insulating film 21a and the second block insulating film 221 do not pass electric charges to the conductive film 21 that accumulate in the charge trap film 222, and they also do not pass electric charges from the conductive film 21 to the charge trap film 222. Thus, the memory cell MC can store and erase data in the charge trap film 222.

The core layer 230 fills the inner space of the cylindrical semiconductor body 210. The core layer 230 has, for example, a columnar shape, and is an insulating material, such as silicon oxide.

The semiconductor device 100a also includes a semiconductor part 14 (see FIG. 1). The semiconductor part 14 is positioned between the stacked body 2 and the semiconductor part 13. The semiconductor part 14 is provided between the insulating film 2g and the insulating film 22 closest to the semiconductor part 13. The semiconductor part 14 functions as a source-side select gate SGS, for example.

Figure 4:
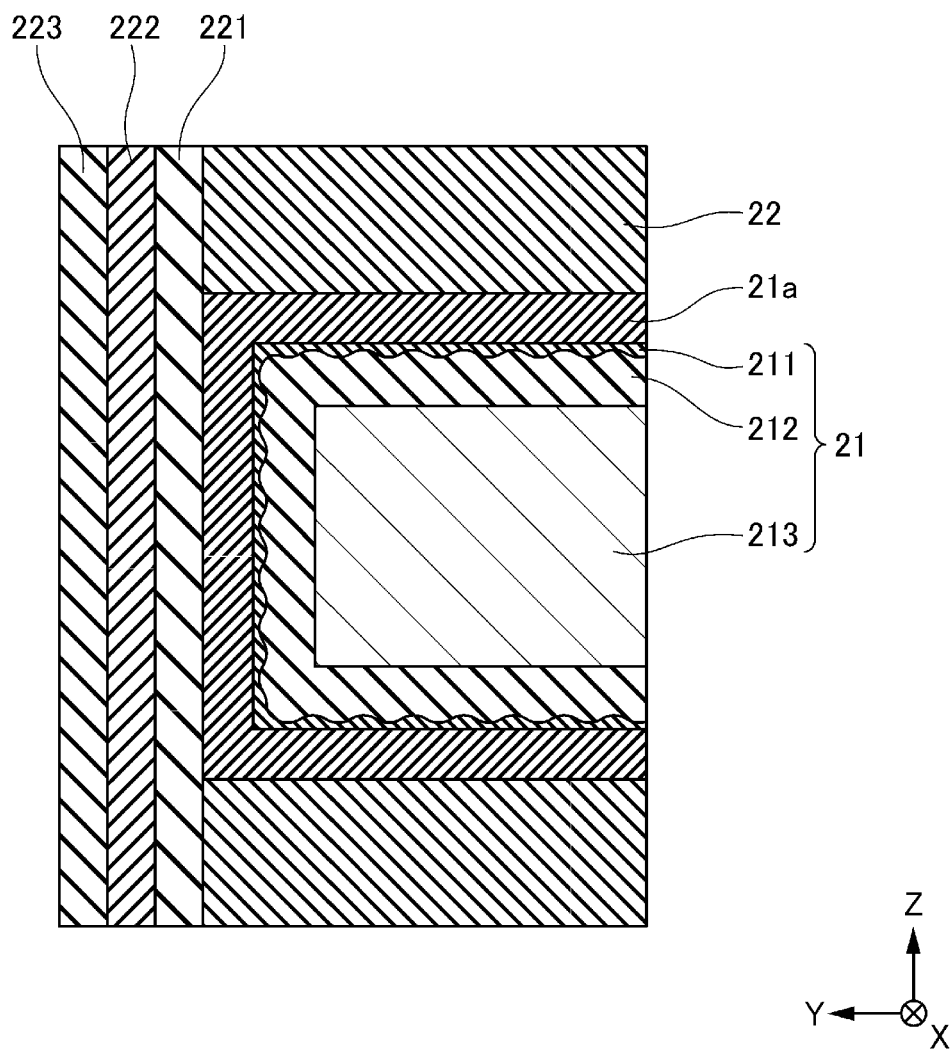
FIG. 4 is a view showing a more detailed structure example of a conductive film and its surroundings.

FIG. 4 is a cross-sectional view showing a more detailed structure example of the conductive film 21 and its surroundings. The conductive films 21 that function as a word line WL are provided between mutually adjacent insulating films 22 in the Z direction. The first block insulating film 21a is provided around the conductive film 21. In this first embodiment, the conductive film 21 includes a first metal film 211, a second metal film 212, and a third metal film 213.

The first metal film 211 comprises nitrogen (N) and titanium (Ti) or tungsten (W). The first metal film 211 comprises, for example, titanium nitride or tungsten nitride. The first metal film 211 is, for example, titanium nitride or tungsten nitride. The first metal film 211 is provided between the first block insulating film 21a and the second metal film 212.

The second metal film 212 comprises tungsten (W). The second metal film 212 is, for example, tungsten (W). The second metal film 212 is provided between the first metal film 211 and the third metal film 213.

The third metal film 213 comprises molybdenum (Mo). The third metal film 213 is, for example, molybdenum (Mo).

Figure 5:
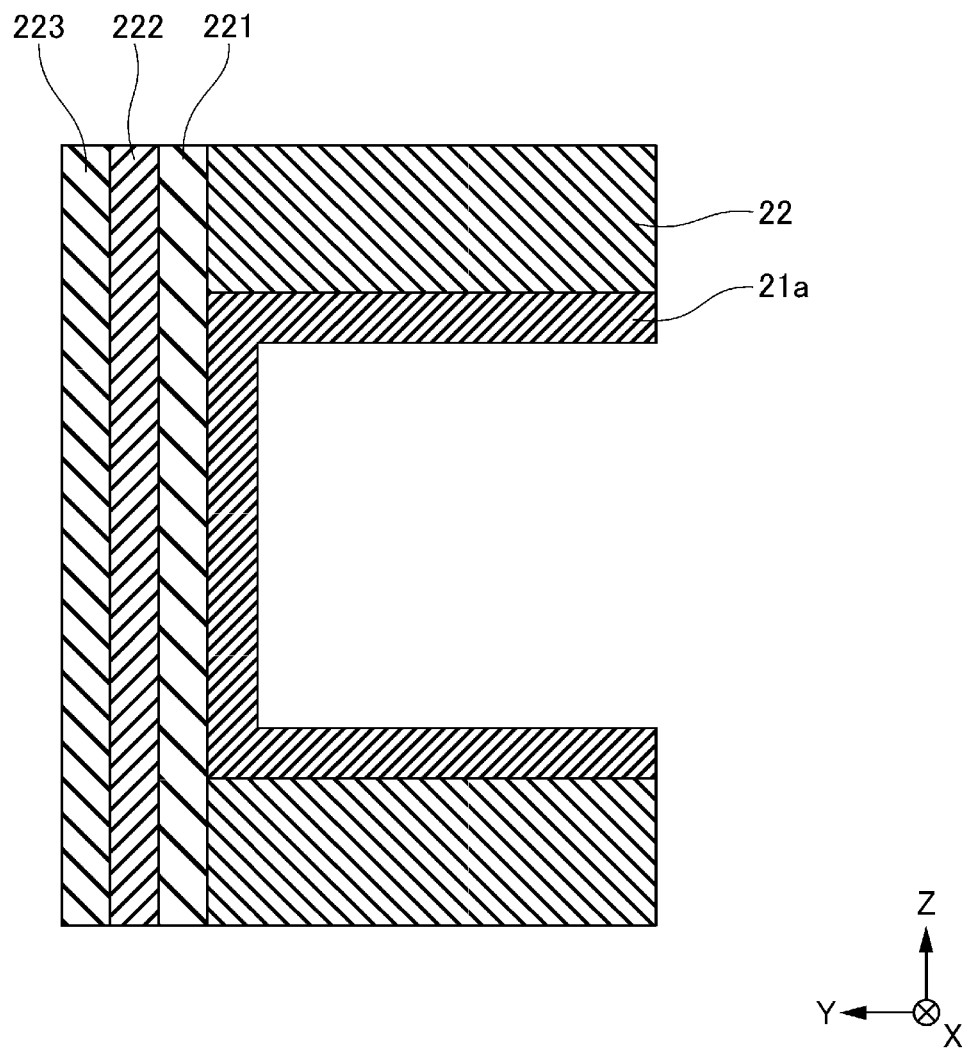
FIGS. 5 to 7 are cross-sectional views illustrating aspects related to a method for manufacturing a semiconductor device according to an embodiment.

A method of forming the conductive films 21 will be described with reference to FIGS. 5 to 7. As illustrated in FIG. 5, the first block insulating film 21a is formed by depositing a thin film of $Al_2O_3$ on an inner wall of the space left by removal of a sacrificial film. The first block insulating film 21a can be formed by use of a thermal chemical vapor deposition (CVD) method, an atomic layer deposition (ALD) method, or the like.

Figure 6:
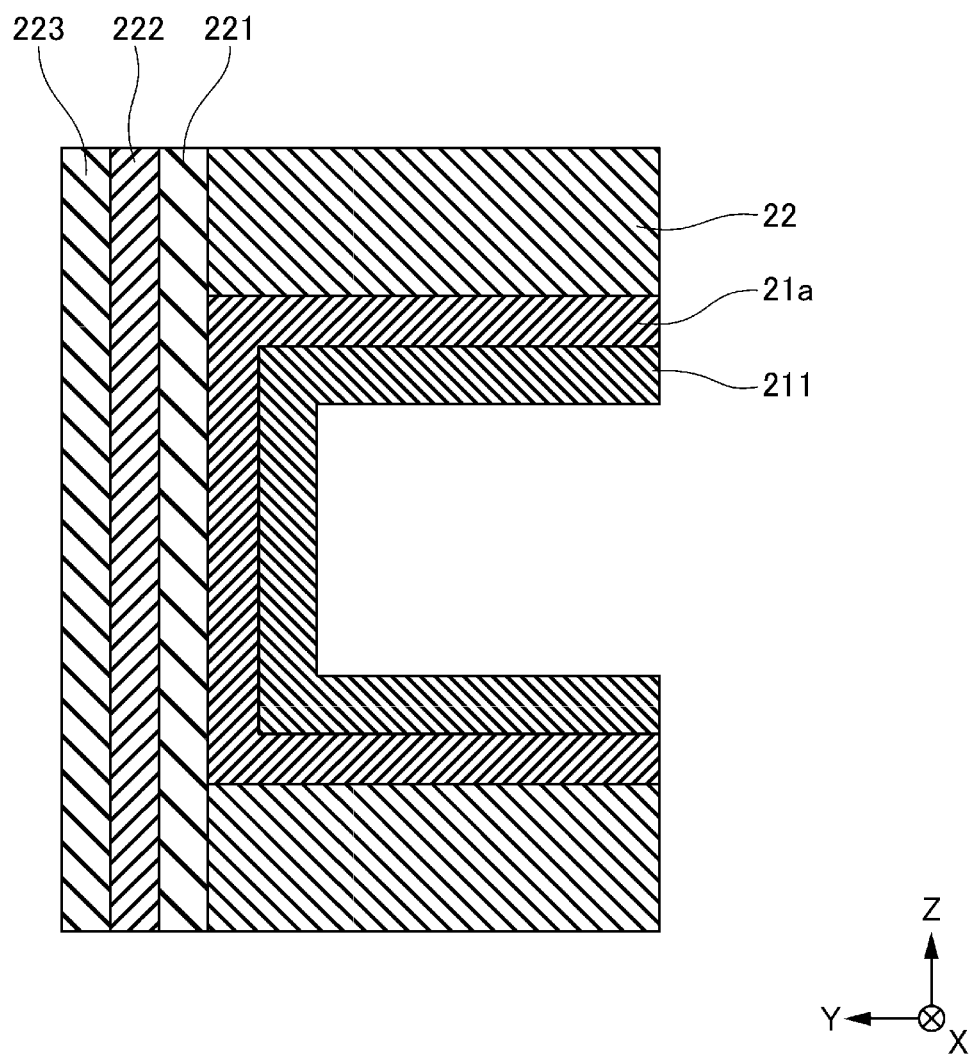

Subsequently, as illustrated in FIG. 6, a first metal film 211 is formed. The first metal film 211 is formed on the first block insulating film 21a by using, for example, ammonia ($NH_3$) as a reduction gas with $TiCl_4$, $WCl_5$, or $WCl_4$ in a thermal CVD method or an ALD method.

Figure 7:
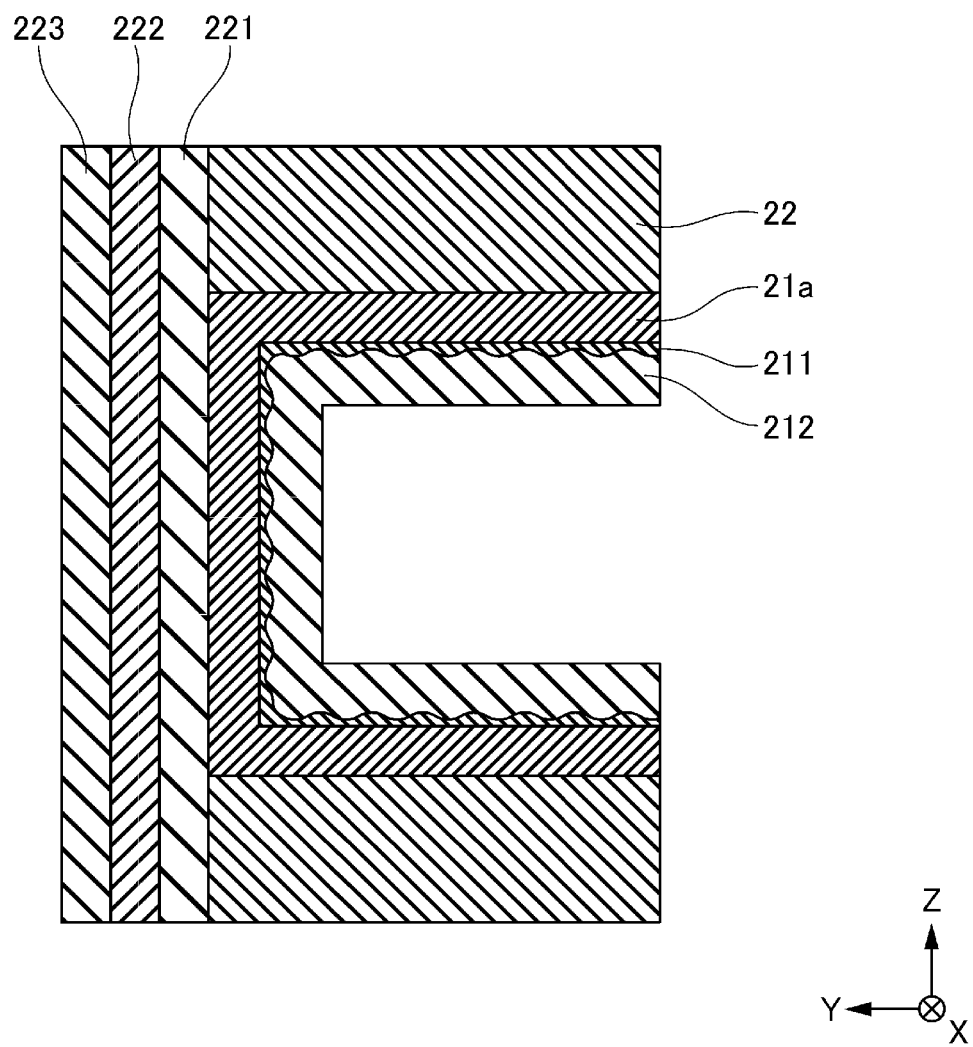

Then, a second metal film 212 is formed, as illustrated in FIG. 7. The second metal film 212 is formed on the first metal film 211 by using, for example, hydrogen ($H_2$) as a reduction gas with $WCl_5$ or $WOCl_4$ in a thermal CVD method or an ALD method. Using a tungsten chloride-type gas, such as $WCl_5$ or $WOCl_4$, partially etches the first metal film 211 and increases the interface roughness on the second metal film 212 side of the first metal film 211. In order to facilitate this roughening of the first metal film 211, it is desirable to set the deposition temperature of the first metal film 211 to be low and the deposition temperature of the second metal film 212 to be high. It is particularly desirable to set the deposition temperature of the first metal film 211 to be lower than that of the second metal film 212. In addition, increasing chlorine that is contained in the first metal film 211 enables increasing the interface roughness of the first metal film 211. In one example, chlorine that is contained in the first metal film 211 can be increased by reducing the amount of $NH_3$ or increasing the amount of $TiCl_4$, $WCl_5$, or $WOCl_4$, in forming the first metal film 211.

Subsequently, a third metal film 213 is formed. The third metal film 213 is formed on the second metal film 212 by using $H_2$ as a reduction gas with $MoOCl_4$ or $MoO_2Cl_2$, in a thermal CVD method or an ALD method. Upon forming the third metal film 213, the conductive film 21 is completed, and the structure as illustrated in FIG. 4 is provided.

Figure 8:
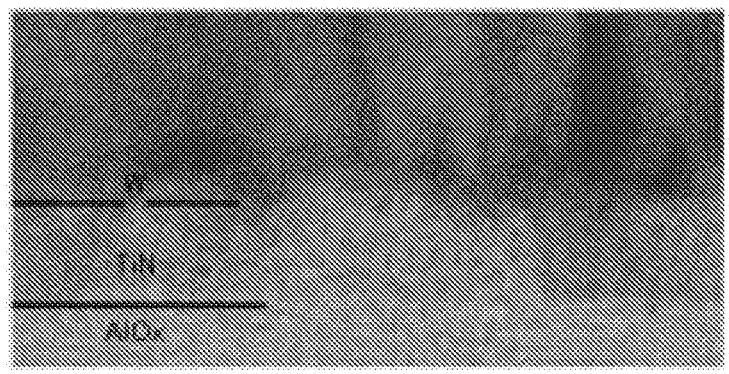
FIG. 8 depicts a transmission electronic microscope (TEM) image of a conductive film and its surroundings.
Figure 9:
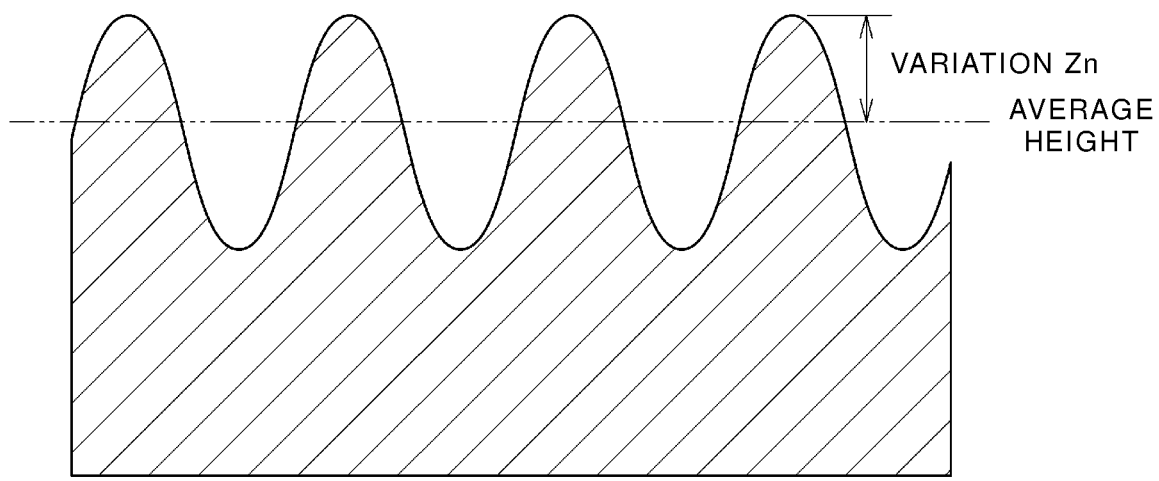
FIG. 9 illustrates aspects related to a definition of interface roughness.

FIG. 8 depicts a TEM image of parts of the first block insulating film 21a (region labeled "AlOx"), the first metal film 211 (region labeled "TiN"), and the second metal film 212 (region "W"). A variation in interface of each measured position can be calculated, as illustrated in FIG. 9. Specifically, a variation Zn relative to an average height is calculated at each position.

An arithmetic average roughness (Ra value) is calculated by the formula f1 based on the variations Zn.

$$R_a = \frac{1}{N}\sum_{n=1}^{N} Z_n \tag{f1}$$

A root mean square roughness (RMS value) is calculated by the formula f2 based on the variations Zn.

$$\text{RMS} = \sqrt{\frac{1}{N}\sum_{n=1}^{N} Z_n^2} \tag{f2}$$

As described above, the semiconductor device 100a of this present embodiment includes the charge trap film 222, the conductive film 21, and the first block insulating film 21a and the second block insulating film 221, which are provided between the charge trap film 222 and the conductive film 21. The conductive film 21 is formed as a stacked film of the first metal film 211, the second metal film 212, and the third metal film 213. The interface roughness (interfacial roughness) on the second metal film 212 side of the first metal film 211 is greater than that on the first block insulating film 21a side (opposite side) of the first metal film 211. That is, the Ra value at the interface on the second metal film 212 side of the first metal film 211 is greater than that at the interface on the first block insulating film 21a side of the first metal film 211. In addition, the RMS value at the interface on the second metal film 212 side of the first metal film 211 is greater than that at the interface on the first block insulating film 21a side of the first metal film 211.

This high interface roughness on the second metal film 212 side of the first metal film 211 allows the interface between the first metal film 211 and the second metal film 212 to better trap oxygen that diffuses out from the third metal film 213 due to a post-heat load. Thus, it is possible to reduce deterioration in electric charge retaining characteristics due to oxygen diffusion to the charge trap film 222.

The first metal film 211 comprises TiN or WN. The second metal film 212 comprises W. The third metal film 213 comprises Mo.

The Ra value of the interface roughness on the second metal film 212 side of the first metal film 211 is, for example, in a range of 0.2 nm to 1.0 nm, endpoints inclusive. The RMS value of the interface roughness on the second metal film 212 side of the first metal film 211 is, for example, in a range of 0.3 nm to 1.5 nm, endpoints inclusive.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a tunnel insulating film;
a charge trap film on the tunnel insulating film;
a block insulating film on the charge trap film, the charge trap film being between the tunnel insulating film and the block insulating film; and
a conductive film on the block insulting film, the block insulating film being between the charge trap film and the conductive film, the conductive film including a first metal film adjacent to the block insulating film and a second metal film on the first metal film, the first metal film being between the block insulating film and the second metal film, wherein
the first metal film has an interfacial roughness on a side facing the second metal film that is greater than an interfacial roughness on a side facing the block insulating film, and
the first metal film directly contacts the block insulating film.

2. The semiconductor device according to claim 1, wherein the first metal film comprises titanium nitride.

3. The semiconductor device according to claim 1, wherein the first metal film comprises tungsten nitride.

4. The semiconductor device according to claim 1, wherein the first metal film comprises titanium and nitrogen.

5. The semiconductor device according to claim 1, wherein the first metal film comprises tungsten and nitrogen.

6. The semiconductor device according to claim 1, wherein the second metal film comprises tungsten.

7. The semiconductor device according to claim 1, wherein the conductive film further includes a third metal film on the second metal film, the second metal film being between the first metal film and the third metal film.

8. The semiconductor device according to claim 7, wherein the third metal film comprises molybdenum.

9. The semiconductor device according to claim 1, wherein an arithmetic average roughness value of the interface roughness on the second metal film side of the first metal film is in a range of 0.2 nm to 1.0 nm, endpoints inclusive.

10. The semiconductor device according to claim 1, wherein a root mean square roughness value of the interface roughness on the second metal film side of the first metal film is in a range of 0.3 nm to 1.5 nm, endpoints inclusive.

11. The semiconductor device according to claim 1, further comprising:
a semiconductor pillar extending lengthwise in a first direction, wherein
the tunnel insulating film is on an outer peripheral surface of the semiconductor pillar,
the conductive film surrounds the semiconductor pillar in a plane perpendicular to the first direction, and
the block insulating film includes a portion adjacent to the conductive film in the first direction.

12. The semiconductor device according to claim 1, wherein
each conductive layer includes a third metal film, and
the third metal film directly contacts the second metal film.

13. A memory device, comprising:
a plurality of conductive films spaced from one another in a first direction; and
a plurality of semiconductor pillars extending lengthwise in the first direction through the plurality of conductive films, each semiconductor pillar having a tunnel insulating film on an outer peripheral surface thereof, a charge trap film on the tunnel insulating film, and a block insulating film on the charge trap film with the charge trap film being between the tunnel insulating film and the block insulating film, wherein
each conductive film surrounds the semiconductor pillars in a plane perpendicular to the first direction and contacts the block insulating film on the semiconductor pillars,
each conductive film includes a first metal film adjacent to the block insulating film and a second metal film on the first metal film, the first metal film being between the block insulating film and the second metal film,
the first metal film has an interfacial roughness on a side facing the second metal film that is greater than an interfacial roughness on a side facing the block insulating film, and
the first metal film comprises either tungsten nitride or titanium and nitrogen.

14. The memory device according to claim 13, wherein
each conductive film further includes a third metal film on the second metal film,
the second metal film is between the first metal film and the third metal film, and
the third metal film is molybdenum.

15. The memory device according to claim 13, wherein an arithmetic average roughness value of the interface roughness on the second metal film side of the first metal film is in a range of 0.2 nm to 1.0 nm, endpoints inclusive.

16. The memory device according to claim 13, wherein a root mean square roughness value of the interface roughness on the second metal film side of the first metal film is in a range of 0.3 nm to 1.5 nm, endpoints inclusive.

17. A semiconductor device, comprising:
a stacked body comprising alternating insulating layers and conductive layers stacked in a first direction; and
a plurality of memory pillars extending through stacked body in the first direction, wherein
each conductive layer has an outer film layer facing the insulating layers and the memory pillars and a first inner film layer adjacent to the outer film layer,
the outer film layer has an interfacial roughness on a side facing the first inner film layer that is greater than an interfacial roughness on a side facing away from the first inner film layer,
each conductive layer includes a second inner film layer, and
the first inner layer is between the second inner layer and the outer film layer.

18. The semiconductor device according to claim 17, outer film layer comprises tungsten nitride and the first inner film layer is metallic tungsten.

19. The semiconductor device according to claim 18, wherein
the second inner film layer is molybdenum.

20. The semiconductor device according to claim 17, wherein the second inner film layer comprises molybdenum.

* * * * *